United States Patent [19]
Liu

[11] Patent Number: 5,251,101
[45] Date of Patent: Oct. 5, 1993

[54] DISSIPATING STRUCTURE FOR CENTRAL PROCESSING UNIT CHIP

[76] Inventor: Te-Chang Liu, No. 15-3, Lane 86, Fung Chiang Rd., Tai Shan Hsiang, Taipei Hsien, Taiwan

[21] Appl. No.: 972,384
[22] Filed: Nov. 5, 1992
[51] Int. Cl.⁵ ............................................. H05K 7/20
[52] U.S. Cl. ..................................... 361/717; 24/625; 248/510; 257/718; 44/516
[58] Field of Search .......................... 165/80.3, 185; 174/16.3; 361/383, 386–389; 267/150, 160; 248/228, 316.7, 505, 510; 24/457, 458, 555, 625; 411/352, 516, 517; 257/706, 707, 717, 718, 719

[56] References Cited

U.S. PATENT DOCUMENTS

| | | | |
|---|---|---|---|
| 4,716,494 | 12/1987 | Bright | 361/386 |
| 5,099,550 | 3/1992 | Beane | 24/555 |
| 5,130,888 | 7/1992 | Moore | 361/386 |
| 5,208,731 | 5/1993 | Blomquist | 361/388 |

OTHER PUBLICATIONS

"Spring Clip—Heat Sink", IBM Tech Discl. Bull. vol. 23 No. 12 May 1981, p. 5303, Almquist et al.

Primary Examiner—Gerald P. Tolin
Attorney, Agent, or Firm—Morton J. Rosenberg; David I. Klein

[57] ABSTRACT

A dissipating structure for central processing unit chip includes a frame, a fixture, a felt board, a dissipating board, and a fan, wherein an open end of the fixture is rotatably secured to the frame. The rest edges of the fixture are formed like holding portion adapted to hold the chip, the felt board, and the dissipating board in place, sequentially. A plurality of dissipating elements are formed on the dissipating board adapted to dissipate heat created by cpu chip. Four dissipating blocks are formed at four corners of the dissipating board each having an aperture adapted to secure the fan thereon by means of screws.

2 Claims, 8 Drawing Sheets

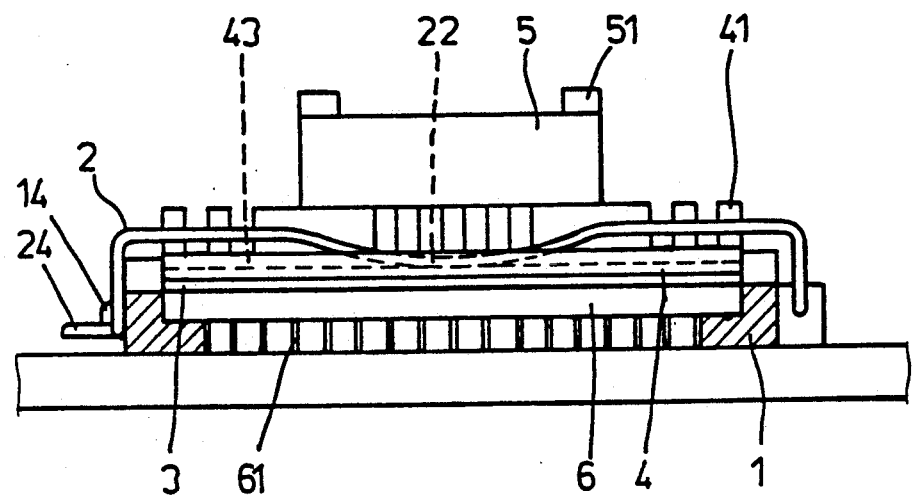
F I G. 4

DISSIPATING STRUCTURE FOR CENTRAL PROCESSING UNIT CHIP

FIELD OF THE INVENTION

This invention relates to a dissipating structure. More particularly, a dissipating structure for central processing unit chip.

BACKGROUND OF THE INVENTION

Electronics are major component at this century for most products to achieve their functions. Such as rocket, space shuttle . . . etc. Furthermore electronic components are precise components which require a constant temperature to perform its precision function, therefore, temperature control has always a major issues for R and D department to work on. Among those electronic components, Central Processing Unit component is a major problem to maintain a constant temperature since it performs most of the important job in all electronics.

A plurality of electric dissipating structures were developed, thereafter, such as FIGS. 6, 7, 8 and 9 have shown a cpu chip B secured in a frame A, a dissipating board C seating thereon. All parts are either fastened by a clip D, as shown in FIG. 7, or by the frame itself, as shown in FIG. 8, or by screws, as shown in FIG. 9. All such designs have encountered with at least one shortcoming which is a loosening problem and which results to a noise sound. A further problem of which is that the frame is made of plastic material, such as FIG. 9, which is easy to be broken.

The inventor, in view of this, has invented this invention which has improved all the previously mentioned shortcomings.

SUMMARY OF THE INVENTION

It is the primary object of the present invention to provide a dissipating structure for central processing unit chip which is easy to assemble and disassemble.

It is another object of the present invention to provide a dissipating structure for central processing unit chip which is able to dissipate heat created by cpu chip.

It is a further object of the present invention to provide a dissipating structure for central processing unit chip which can hold chip securely.

It is still a further object of the present invention to provide a dissipating structure for central processing unit chip which is inexpensive to produce.

BRIEF DESCRIPTION OF THE DRAWINGS

FIG. 4 is a side elevational view of FIG. 3;

DETAILED DESCRIPTION OF THE PREFERRED EMBODIMENT

Figure 1:
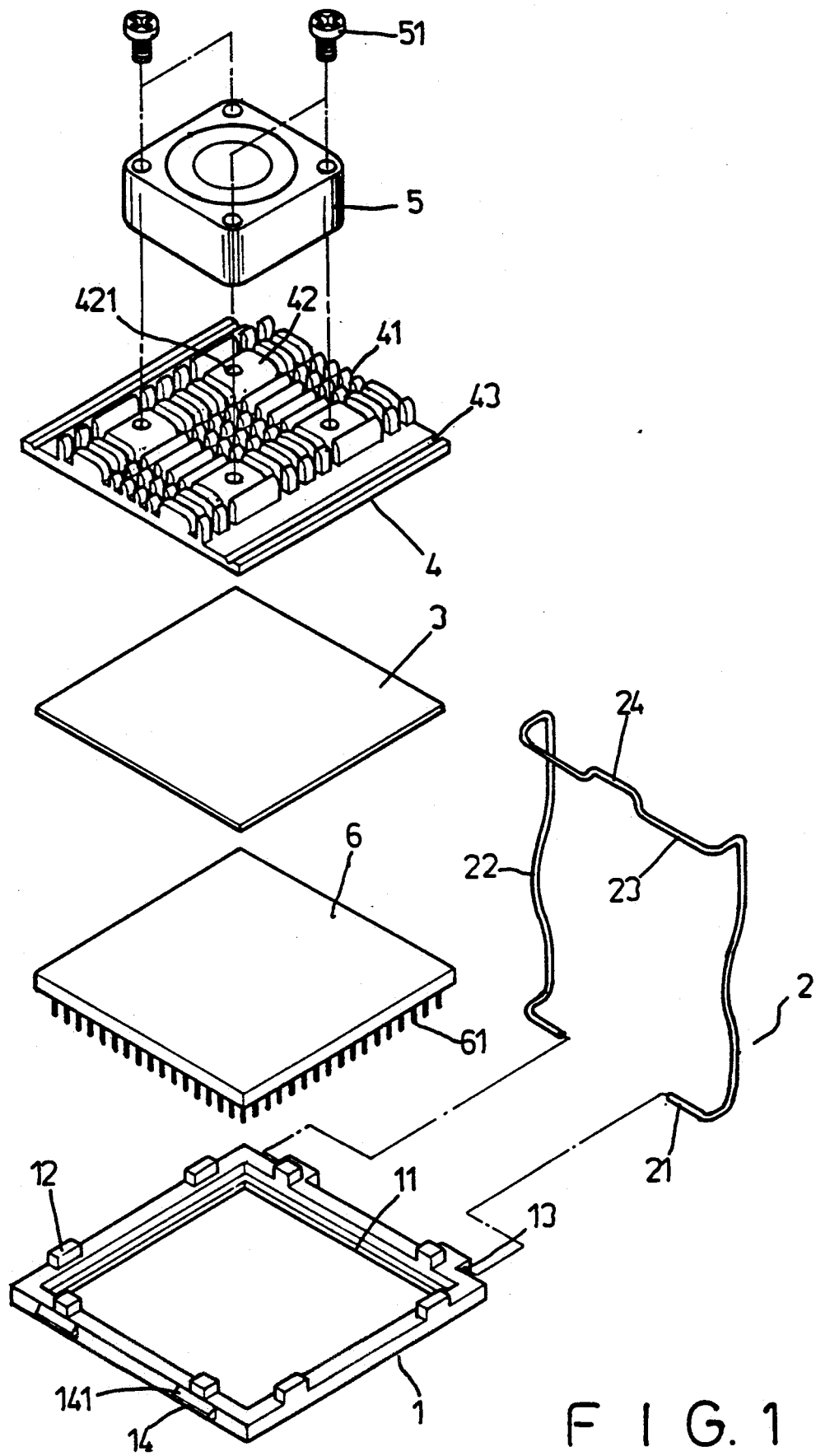
FIG. 1 is a fragmentary view of the present invention.

Reference is now made to the drawings wherein the showing are for the purpose of illustrating only and not for the purpose of limiting the same, FIG. 1 shows an exploded view of the present invention which is essentially composed of a frame 1, a clip 2, a felt board 3, a dissipating board 4, a fan 5, and a central processing unit chip 6 (hereinafter referred to as cpu.)

The frame 1 is a square strip having a flange 11 at the inner perimeter which resets the edges of the cpu chip 6, the felt board 3, and the dissipating board 4 therein, sequentially, a plurality of spaced blocks 12, two lugs 13 extending from one edge adapted to hook the clip 2 and two protuberances 14 extending from opposite edge each having slanting surface adapted for easy sliding for the clip 2.

The clip 2 is made from a flexible metallic material and bent into shape having an open end 21 rotatably hinged to the lugs 13, holding portions 22, 23 at the rest edges to hold the dissipating board 4 securely, and a finger grip 24.

The felt board 3 has the same size as of the chip 6 located inbetween the chip 6 and the dissipating board 4 adapted to prevent the dissipating board from slipping and to dissipate heat created by said chip as well. The felt board 3 is removable in the event that the chip 6 is too thick.

The dissipating board 4 has also the same size as of the chip 6 having a plurality of dissipating elements 41 fastened on top thereof. Among which elements 41, four blocks 42 are located at four corners each has an aperture 421 adapted to secure a fan 5 thereon by means of screws 51. Two grooves 43 are located at respective sides adapted to receive the holding portions 22 of the clip 2.

Figure 2:
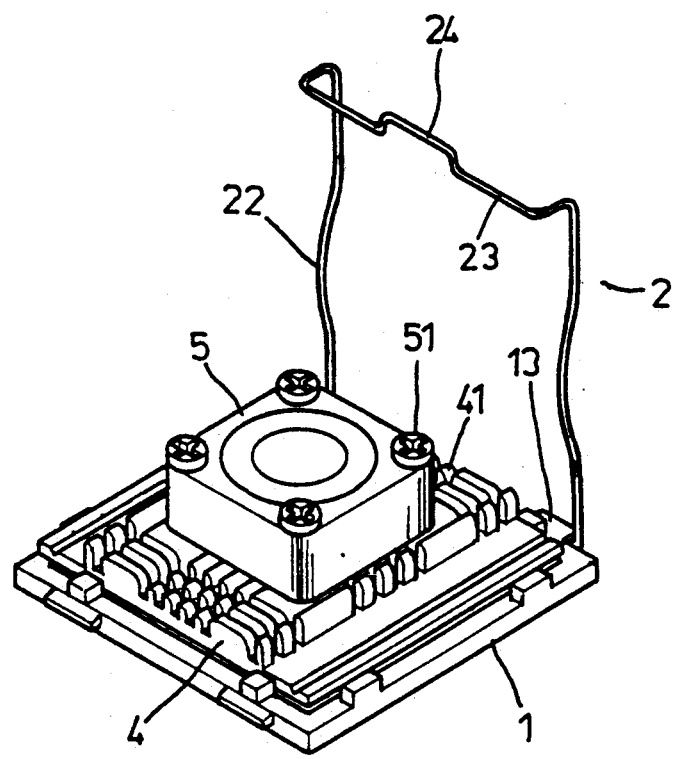
FIG. 2 is a perspective view of FIG. 1 showing a fixture in an unlocked position.
Figure 3:
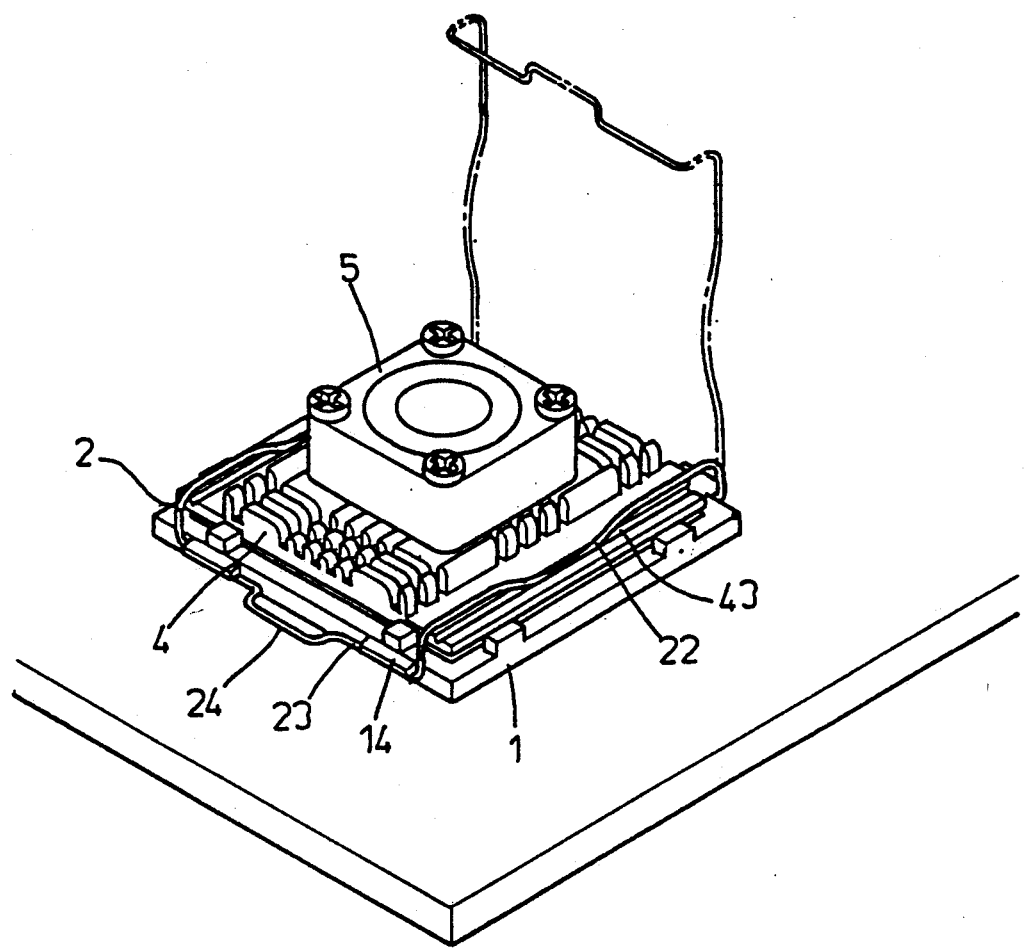
FIG. 3 is a perspective view of FIG. 2 showing the fixture in a locked position.

To assemble, place the chip 6, the felt board 3, and the dissipating board 4 on the frame 1 allowing the edges of the chip 6 rest on the annular flange 11, then secure the fan 5 onto the dissipating board 4, and the clip 2 to the lugs 13 of the frame 1, as shown in FIG. 2. When the clip 2 is pushed down and the holding portion 23 is blocked by the protuberances 14, as shown in FIGS. 3 and 4, the present invention is completed with its assembly procedure.

Figure 5:
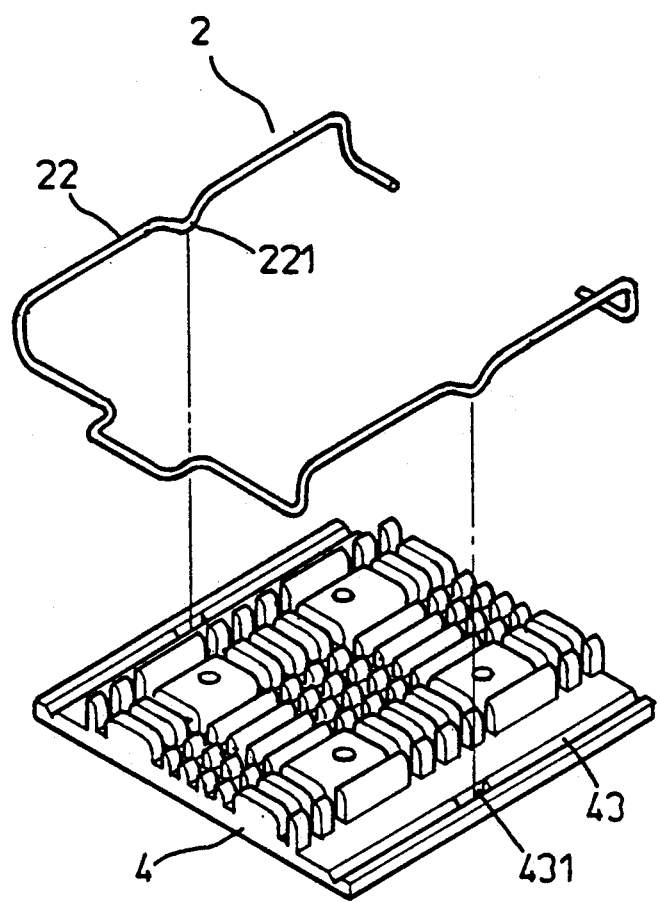
FIG. 5 is a perspective view of FIG. 1 showing a second embodiment of the fixture.
Figure 6:
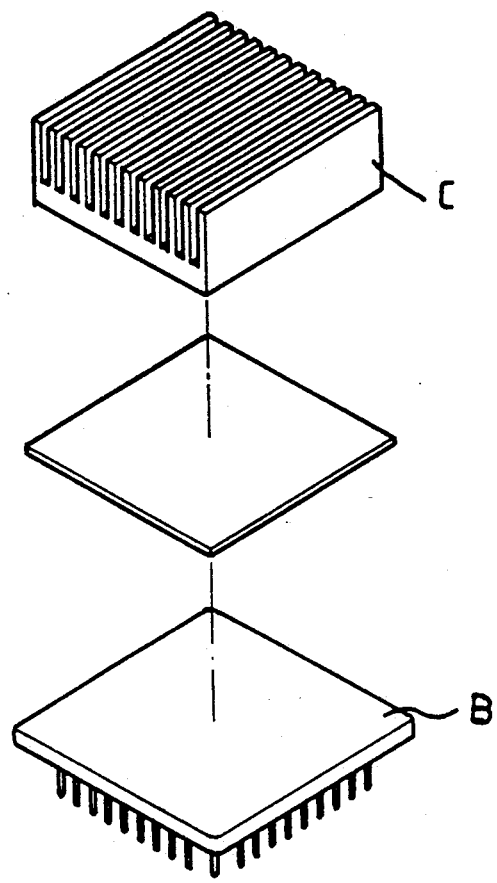
FIGS. 6, 7, 8 and 9 are prior arts.
Figure 7:
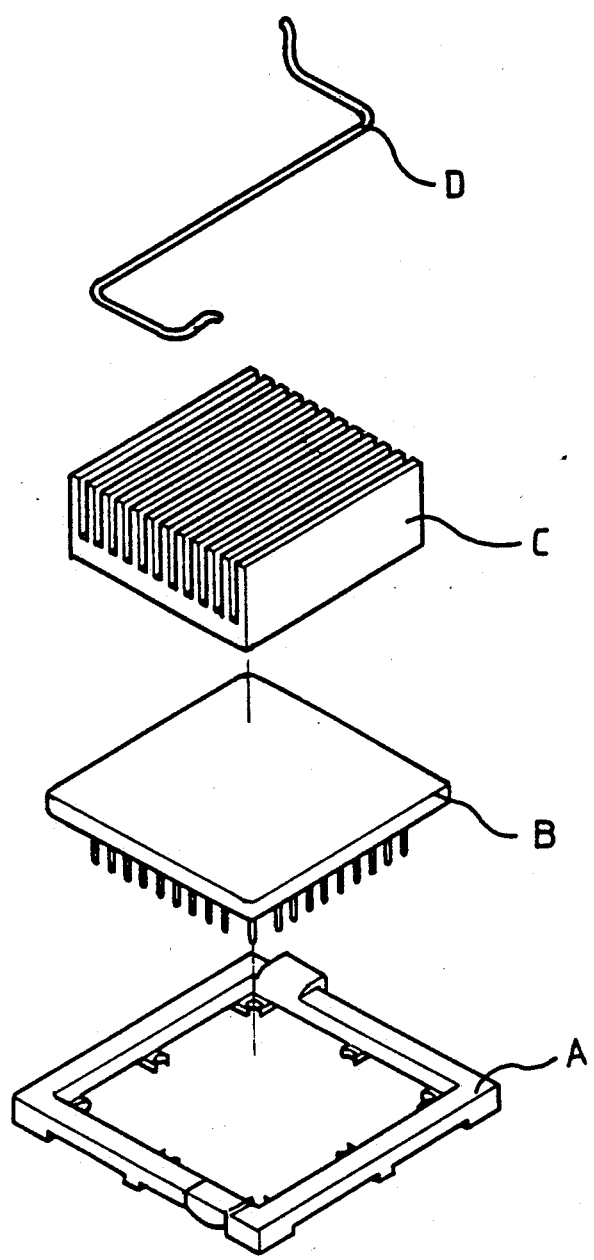
Figure 9:
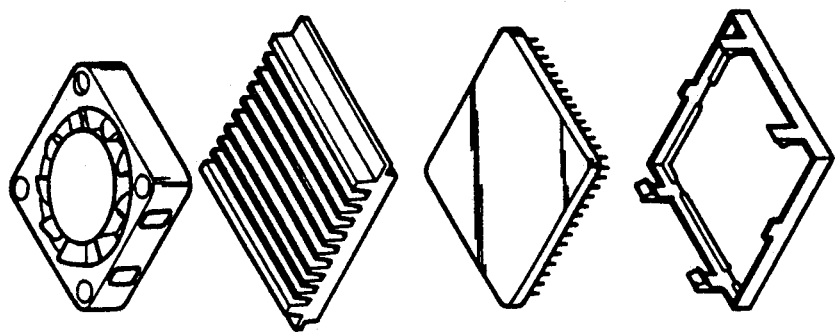
Figure 8:
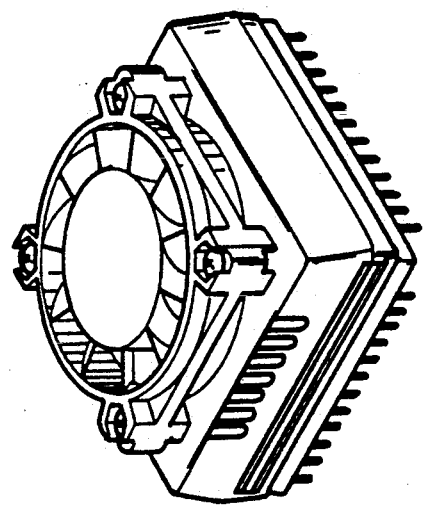

A further embodiment is introduced in FIG. 5 which shows each of the holding portions 22 having a bending portion adapted to be inserted into a recess 431 at each groove 43 to ensure the fastening securely.

While there has been described and illustrated a few specific embodiments of the invention, it will be clear that varations in the details of the embodiments specifically illustrated and described may be made without departing from the true spirit and scope of the invention as defined in the appended claims.

I claim:

1. A dissipating structure for central processing unit chip comprising:

a frame of a square strip having an annular flange at inner perimeter resting the edges of a cpu chip, a plurality of circumferentially spaced blocks extending upwardly one side thereof, two lugs extending from one edge, and two protuberances;

a dissipating board being shaped like said cpu chip having a plurality of dissipating elements fastened on top thereof, which includes at least four blocks at four corners each having an aperture adapted to fasten a fan thereon, two grooves at respective sides;

a clip being made from a flexible metallic material and bent into shape having an open end rotatably hinged to said lugs of said frame, holding portions at rest edges and a finger grip;

a felt board being shaped like said cpu chip adapted to prevent said dissipating board from slippery and to dissipate heat created by said cpu chip as well.

2. A dissipating structure for central processing unit chip of claim 1, wherein said fixture has a pair of bending portion at respective holding area, and said dissipating board has two recess at respective grooves adapted to receive said bending portions of said fixture securely.

* * * * *